(12) United States Patent
Wise et al.

(10) Patent No.: US 7,747,926 B2
(45) Date of Patent: Jun. 29, 2010

(54) METHODS AND APPARATUS FOR A MEMORY DEVICE WITH SELF-HEALING REFERENCE BITS

(75) Inventors: Loren J. Wise, Tempe, AZ (US); Thomas W. Andre, Austin, TX (US); Mark A. Durlam, Chandler, AZ (US); Eric J. Salter, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 960 days.

(21) Appl. No.: 11/416,850

(22) Filed: May 2, 2006

(65) Prior Publication Data

US 2007/0260962 A1 Nov. 8, 2007

(51) Int. Cl.
*G11C 29/00* (2006.01)
(52) U.S. Cl. .......................... 714/763; 714/25; 714/777
(58) Field of Classification Search ................. 714/763, 714/25
See application file for complete search history.

(56) References Cited

U.S. PATENT DOCUMENTS

| 4,295,207 | A | * | 10/1981 | Resnick | ...................... 341/166 |
|---|---|---|---|---|---|
| 6,055,178 | A | | 4/2000 | Naji | |
| 6,098,187 | A | * | 8/2000 | Takahashi | .................... 714/741 |
| 6,418,068 | B1 | | 7/2002 | Raynham | |
| 6,445,612 | B1 | | 9/2002 | Naji | |
| 6,621,729 | B1 | | 9/2003 | Garni | |
| 6,643,195 | B2 | | 11/2003 | Eldredge | |
| 7,342,520 | B1 | * | 3/2008 | Katzman et al. | ............ 341/100 |

OTHER PUBLICATIONS

Durlam, M., Naji, P., Omair, A., Deherrera, J., Calder, J et al. A Low Power 1 Mbit MRAM Based on 1T1MTJ Bit Cell Integrated With Copper Interconnects, 2002 Symposium on VLSI Circuits Digest of Technical Papers, pp. 158-161.

* cited by examiner

*Primary Examiner*—Guy J Lamarre
(74) *Attorney, Agent, or Firm*—Ingrassia Fisher & Lorenz, P.C.

(57) ABSTRACT

A memory device, such an MRAM device, includes self-healing reference bits (104) associated with a set of array bits (102). The memory performs an error detection step (e.g., using an error-correction coding (ECC) algorithm, to detect the presence of a set of errors within the data bits. One of the reference bits (104) is toggled to a different state if an error count is greater than a predetermined threshold. If the set of errors remains unchanged when subsequently read, the reference bit (104) is toggled back to its original state.

18 Claims, 4 Drawing Sheets

METHODS AND APPARATUS FOR A MEMORY DEVICE WITH SELF-HEALING REFERENCE BITS

FIELD OF THE INVENTION

The present invention generally relates to error-correction in memory devices and, more particularly, to error-correction of reference bits used, for example, in connection with magnetoresistive random access memory (MRAM) devices.

BACKGROUND OF THE INVENTION

In order to determine the state of a memory bit inside an array, it is common practice to compare the state of the array bit to the state of a pre-set reference. For example, a mid-point reference signal can be generated by averaging the signal from two reference bits, one in a high signal state, and one in a low signal state.

Memory devices commonly include some form of error correcting code (ECC) in the output logic circuitry. If a memory bit is disturbed from its desired state, or is otherwise read incorrectly, the ECC may be used to discover and possibly correct the memory output. It is not uncommon for reference bits to be disturbed (i.e., changed to an incorrect state) during processing, packaging, and/or at any other time. If a reference bit is disturbed from its original state, the memory bits compared to that reference bit may be subject to an unusually large number of read errors.

Prior art memory systems are incapable of efficiently recovering from the presence of one or more disturbed reference bits. Accordingly, most efforts have been centered on making memory devices more robust—i.e., lowering the rate which reference bit disturbs occurs.

Accordingly, there is a need for a memory device (e.g., a MRAM memory device) incorporating self-healing reference bit methods. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. Conventional terms and processes relating to semiconductor manufacturing, memories, and data correction are known to those skilled in the art, and are therefore not discussed in detail herein.

In general, a memory device, such as an MRAM device, includes self-healing reference bits. The memory device performs an error detection step—e.g., using an error-correction coding (ECC) algorithm—to detect the presence of a set of errors within the data bits. One of the reference bits is toggled to a different state if an error count is greater than a predetermined threshold. If the set of errors remains unchanged when subsequently read, the reference bit is toggled back to its original state. In alternate embodiments, multiple bits per reference pair may be read, and reference bits are toggled when at least two read errors per reference are detected.

Figure 1:
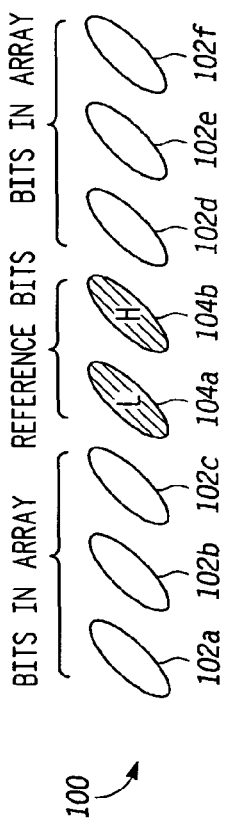
FIG. 1 is a conceptual diagram of an exemplary bit array and associated reference bits.

Referring to FIG. 1, a set of bits 100 includes a number of bits 102 ("array bits" or simply "bits") in an array (e.g., bits 102(a)-(f)) and one or more reference bits 104 (e.g., reference bits 104(a)-(b)) associated therewith. One reference bit 104(a) is designated "L" and nominally has a "low" signal (e.g., a low conductance value in an MRAM memory), and the other reference bit, 104(b), is designated "H" and nominally has a "high" signal (e.g., a high conductance value in an MRAM memory). Reference bits 104 are "associated with" bits 102 in the sense that they are used as references during a read operation performed on bits 102.

In FIG. 1, two reference bits 104 are illustrated. However, the present invention is not so limited, and may be implemented in memories utilizing single reference bits or any other number of reference bits. There may be, for example, 16 to 32 array bits per reference pair. Furthermore, the systems and methods described herein may be used in connection with an MRAM or any memory device that employs a midpoint generation scheme for reference bits.

Figure 2:
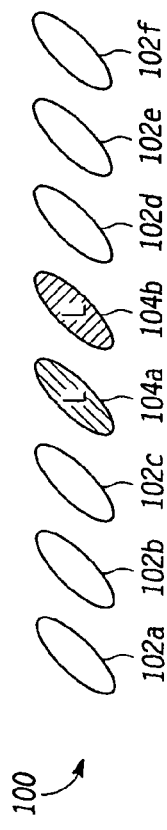
FIG. 2 depicts the bit array of FIG. 1 with a disturbed high reference bit.
Figure 3:
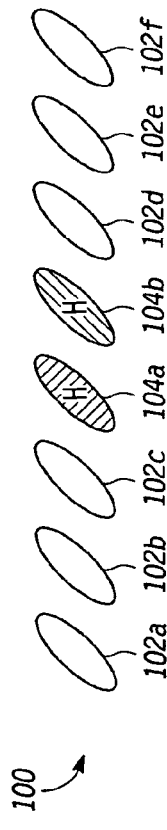
FIG. 3 depicts the bit array of FIG. 1 with a disturbed low reference bit.

As mentioned above, it is not uncommon for reference bits to be disturbed (i.e., changed to an incorrect state) during processing, packaging, and/or at any other time. Thus, as shown in FIG. 2, reference bit 104(b)—which would typically have a "high" signal—might be toggled to a "low" signal state. Likewise, as shown in FIG. 3, bit 104(a) might be toggled from its normal "low" signal state to a "high" signal state.

In FIG. 1, the average signal of reference bits 104 is (L+H)/2. For the error condition shown in FIG. 2, however, the average signal of reference bits 104 is reduced to (L+L)/2. In such a case, one or more low bits 102 may be incorrectly read as "high." On average, half of the read bits will be misread. Similarly, in FIG. 3, the average signal of reference bits 104 is abnormally high—i.e., (H+H)/2. This will result in one or more high bits 102 being incorrectly read as "low." As will be apparent, the presence of even one disturbed reference bit 104 can lead to multiple read errors with respect to any bits 102 associated with the disturbed reference bit 104.

Figure 4:
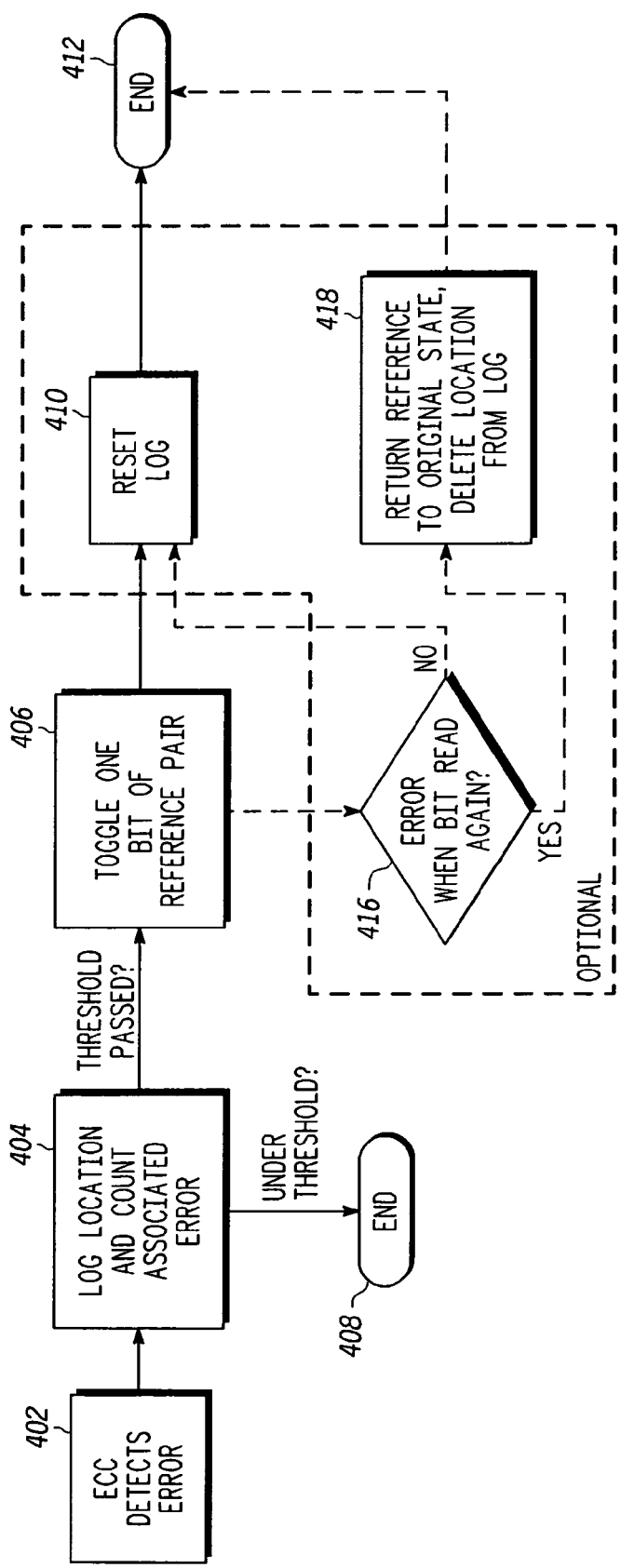
FIG. 4 is a flowchart illustrating a method for self-healing in a memory in accordance with one embodiment.

FIG. 4 is a flowchart depicting a method for self-healing reference bits in accordance with one embodiment. These steps may be performed by a self-heal module within the memory or external to the memory, and may be implemented via hardware, software, firmware, or a combination thereof.

Initially, a suitable error correcting code (ECC) is used to detect errors in the memory array (step 402). As is known in the art, ECC schemes make use of an algorithm and additional bits to store information regarding the associated data bits. This added information can be used to determine errors in those data bits. An ECC memory might use, for example, block codes (e.g., Hamming codes) and convolutional tree codes, and may be implemented in hardware, software, firmware, or any combination thereof. An ECC generally has an error-detecting aspect as well as an error-correcting aspect. Thus, a particular ECC may be capable of detecting multiple bit errors but only capable of locating and correcting a single error. ECC algorithms include, for example, single-bit error correcting (SEC) algorithms and single-bit error correcting/double error detection (SECDED) algorithms. Such ECC algorithms are well known in the art, and need not be described in detail herein.

Regardless of the particular ECC used, the output of the ECC will typically include certain information related to the state of the data bit or bits that are read—e.g., a count of the number of errors as well as the locations (i.e., the physical locations) of the errors. The location of the corresponding reference bits(s) 104 will also be known. Thus, in step 404, the location and count of associated bit errors are logged (i.e., stored), and the accumulated error count (since the log was last reset) is compared to a threshold error value.

This threshold value, $N_{th}$, may be selected depending upon any number of factors. In one embodiment, for example, $N_{th}$ is between 1 and 4, inclusive. In a particular example, where there are 32 array bits per reference pair, $N_{th}$ is equal to 4. In general, it is assumed by the system that a cluster of errors about $N_{th}$ occurred due to a disturbed reference bit, rather than by random chance.

If the accumulated number of errors does not exceed the threshold value, then the method ends (and returns) in step 408. If the accumulated errors exceed the threshold value, then processing continues with step 406, where one bit (e.g., one bit of a reference pair) is toggled. That is, one of bits 104(*a*) or 104(*b*) is changed from its current state to the inverse state. The choice of which bit to toggle may be random, systematic, or made in accordance with any suitable criterion. It will be appreciated that the average signal of the reference pair will be the same, after toggling, regardless of which bit is toggled. Consider, for example, the case shown in FIG. 2, where reference bits 104 are both low. If bit 104(*a*) is toggled, a "LH" combination will result. If bit 104(*b*) is toggled, an "HL" combination will result. In both cases, the midpoint of the pair is the same, and will result in the correct midpoint signal.

In one embodiment, after the reference bit is toggled, the log (i.e., the record of error counts and locations) is suitably reset (410) such that errors in bits associated with the toggled reference bit are removed from the log. After modification of the log, the process ends (and returns) at step 412. In an alternate embodiment, step 410 is not performed, and the procedure progresses from step 406 directly to step 412.

In one embodiment, subsequent to the steps described above, when the ECC is used to read the same set of data bits, the system determines whether the same or substantially the same error count and location occurred (416). If not, the log is reset (410) and the procedure ends and returns (412). If the ECC detects the same error, however, the system returns the previously-toggled reference bit back to its original state (i.e., the state it was in prior to being toggled) (418) and the location of the toggled reference bit is deleted from the log. The procedure then ends and returns (412). The steps corresponding to the alternate embodiment are encompassed by the dotted line in FIG. 4.

Figure 5:
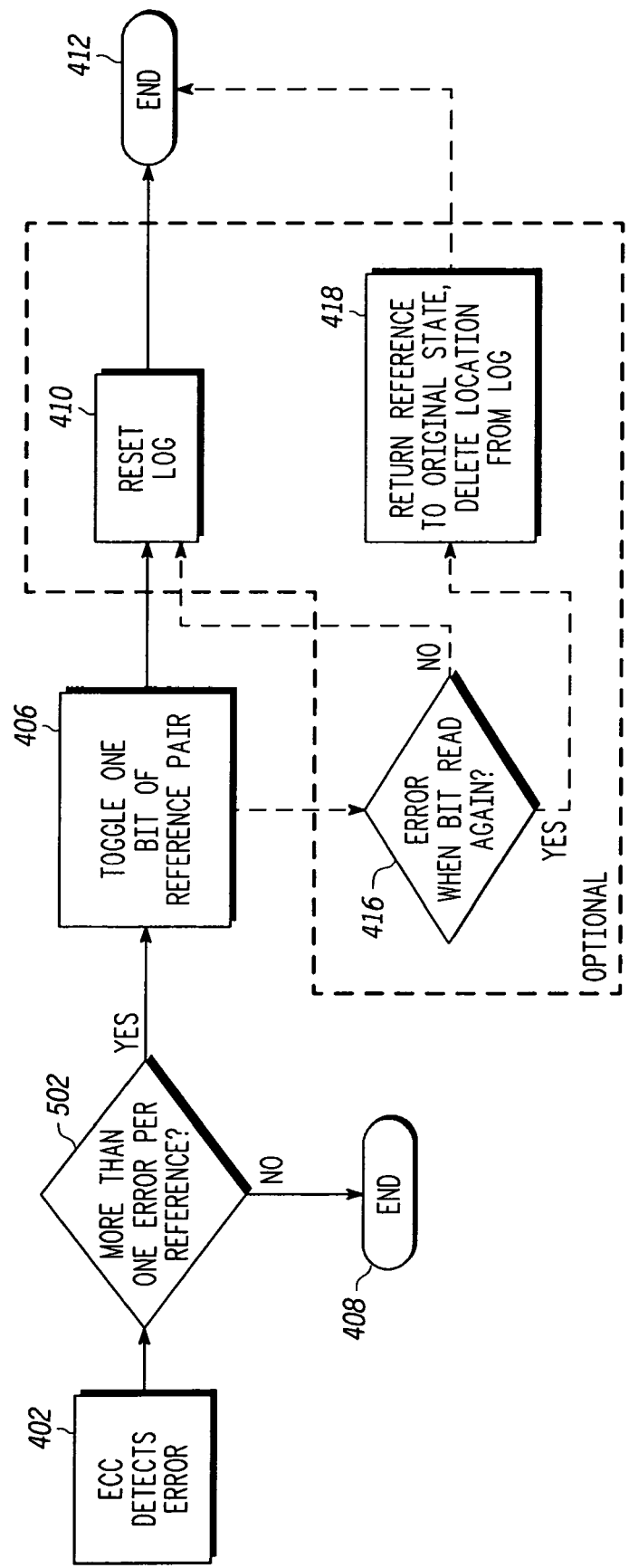
FIG. 5 is a flowchart illustrating a method for self-healing in a memory in accordance with another embodiment.

FIG. 5 is a flowchart depicting an alternate embodiment in which it is assumed that two or more bits per reference pair can be read in a single operation. In this embodiment, after the ECC detects an error (402), the system determines whether there are two or more errors per reference (502). This detection may be accomplished through use of double error correction (DEC) ECC or by separating bits associated with the same reference pair into independent sets of single-error correction ECC. If there are not two or more errors per reference pair, the procedure ends and returns (408). If so, processing continues as described previously in conjunction with FIG. 4. In accordance with this embodiment, it is not necessary to log ECC fail locations. For the embodiment encompassed by the dotted line in FIG. 5, the location of the toggled reference bit can be stored in a log and subsequent reads can be used to verify and potentially return the state of the toggled reference bit. Alternately, the read and potential return of the reference to the original state can be performed immediately after the toggling of the reference bit without requiring the location to be logged.

In accordance with one embodiment, the detection and/or repair of reference bits is performed during regular memory operations, thus allowing for transparent self-healing and undisturbed operation of the memory. For example, ECC detection step 402 may be performed during any convenient read operation. Similarly, the steps of toggling a reference bit (step 406) and/or returning a reference bit back to its original state (step 418) may be performed during any convenient write operation. In this self-healing process, the references are checked and repaired substantially continuously. This helps prevent disturbed reference bits from impacting read reliability.

The log used to store error locations can be implemented using volatile or non-volatile storage elements. Use of non-volatile elements would prevent a power down event from interrupting the detection and correction sequence, but is not necessary for most applications. If non-volatile elements are used that require association with reference pairs, the bits associated with the log may be included in the ECC and reference self healing scheme used.

Figure 6:
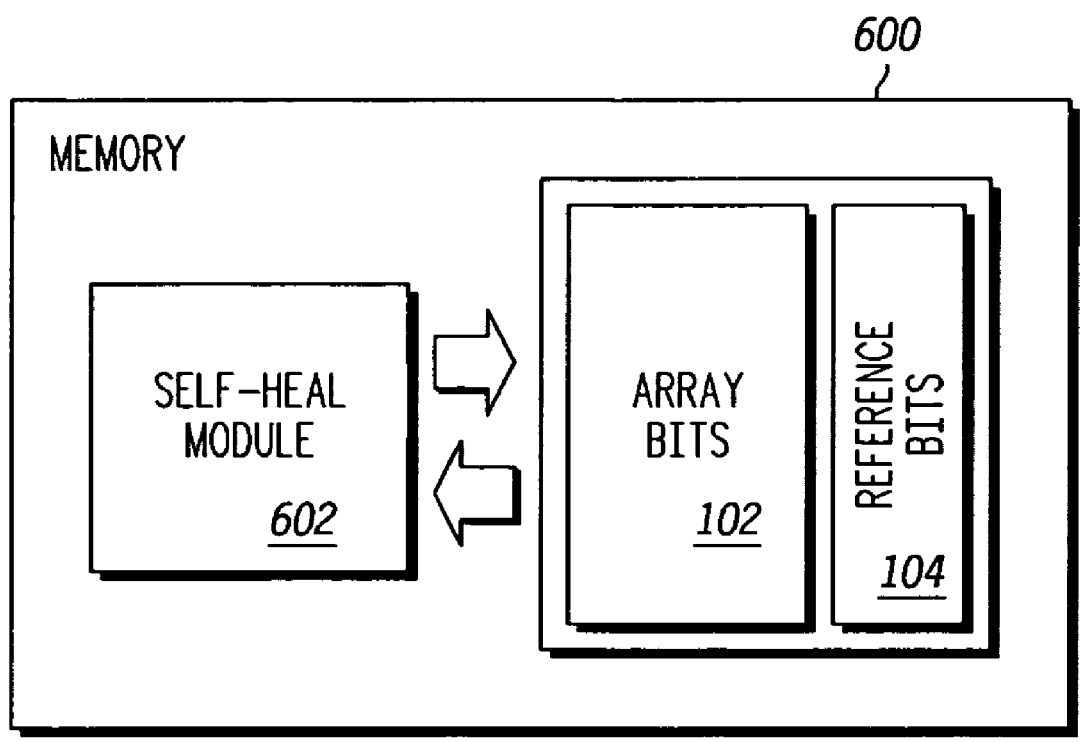
FIG. 6 is a conceptual block diagram of a semiconductor memory in accordance with one embodiment.

The functionality described above may be provided by any combination of hardware, software, firmware, and the like. Referring to the conceptual block diagram illustrated in FIG. 6, for example, an exemplary semiconductor memory 600 includes a set of array bits 102 associated with a set of reference bits 104. A self-heal module 602 is configured to perform one or more ECC error detection steps to detect the presence of errors with array bits 102 and toggle one of the reference bits 104 from one state to a second state if the error count associated with the ECC error detection step is greater than the predetermined threshold, as described above.

In summary, what has been described is a method for error correction in a memory device of the type having a plurality of data bits and associated reference bit(s). The method includes: performing a first error detection step to detect the presence of a first set of errors within the data bits; and toggling the reference bit from a first state to a second state if an error count associated with the first error detection step is greater than a predetermined threshold. In another embodiment, the method further includes performing a second error detection step to detect the presence of a second set of errors within the data bits; and toggling the reference bit back to the first state if the first set of errors is substantially the same as the second set of errors.

In another embodiment, the method further includes storing, after the first error detection step, log values relating to the first set of errors, and resetting the log values after the step of toggling the first reference bit from a first state to a second state.

In a particular embodiment, toggling of the reference bit takes place during a write operation performed on said memory device and the first error detection step takes place during a read operation performed on the memory device.

In various embodiments, the first error detection step and the second error detection step utilize an error-correcting code (ECC).

In a particular embodiment, the memory device further comprises n associated reference bits, where n is greater than 1. The predetermined threshold may be equal to n. The plurality of array bits may include from 16 to 32 array bits, where n=2, and the predetermined threshold is between 2 and 4.

In accordance with another embodiment, a semiconductor memory includes: a set of array bits; a set of reference bits, wherein n reference bits are associated with m array bits; and a self-heal module configured to perform a first ECC error detection step to detect the presence of a first set of errors within the array bits, and toggle a selected one of the n reference bits from a first state to a second state if an error count associated with the first ECC error detection step is greater than a predetermined threshold.

In one embodiment, the self-heal module is further configured to perform a second ECC error detection step to detect the presence of a second set of errors within the data bits and to toggle the selected reference bit back to the first state if the first set of errors is substantially the same as the second set of errors. In another embodiment, the self-heal module is further configured to store log values relating to the first set of errors and to reset the log values after toggling the selected reference bit from a first state to a second state. In another, the self-heal module is configured to toggle the selected reference bit during a write operation, and to perform the first ECC error detection step during a read operation.

In a particular embodiment, wherein n is equal to two, the predetermined threshold is equal to two. In another embodiment, m=16 to 32, n=2, and the predetermined threshold is between 2 and 4.

In accordance with another embodiment, an MRAM memory array includes: a set of magnetoresistive array bits; a first magnetoresistive reference bit(s) associated with the array bits; and a self-heal module configured to perform a first ECC error detection step to detect the presence of a first set of errors within the array bits, and toggle the reference bit from a first state to a second state if an error count associated with the first ECC error detection step is greater than a predetermined threshold.

In one embodiment, the self-heal module is further configured to perform a second ECC error detection step to detect the presence of a second set of errors within the data bits and to toggle the reference bit back to the first state if the first set of errors is substantially the same as the second set of errors.

The MRAM device might include a second reference bit, wherein the first reference bit has a nominally high signal state, and the second reference bit has a nominally low signal state. The array bits may comprise from 16 to 32 array bits, and the predetermined threshold may be between 2 and 4, inclusive.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for error correction in a memory device having a plurality of data bits, each data bit used to store a state at an address of the memory device, and a plurality of reference bits, each reference bit programmed to a known state for the purpose of determining the state of associated data bits, the method comprising:
   reading a first data group of the plurality of data bits within the memory device to determine if an error exists in one of the first data group, the first data group being associated with a reference group of the plurality of reference bits;
   reading a second data group of the plurality of data bits to determine if an error exists in one of the second data group, the second data group being associated with the reference group; and
   comparing the errors found in the first and second data groups to determine if an error exists in the reference group and toggling the reference bit containing the error.

2. The method of claim 1 wherein the first and second reading steps comprise using a Hamming Code.

3. The method of claim 1 wherein the first data group is arraigned parallel to the second data group.

4. The method of claim 1 wherein the reading of the first and second data groups are accomplished simultaneously.

5. The method of claim 1 wherein the identifying and toggling step comprises toggling one or more of the reference bits containing the error in the first reference group by programming the state of a reference bit, the reference bit being associated with the identified error in the first data group and the identified error in the second data group.

6. The method of claim 1 wherein the first reference group comprises a first reference bit programmed to a first state and a second reference bit programmed to a second state for determining the state of a data bit within the first data group.

7. The method of claim 6 wherein the reading a first data group step comprises writing a predetermined state to the first and second reference bits.

8. A semiconductor memory comprising:
   a set of array bits within the semiconductor memory, the set of array bits consisting of m array bits and p array bits;
   a set of reference bits within the semiconductor memory, wherein n reference bits are associated with the m array bits and the p array bits; and
   a self-heal module configured to perform a first ECC error detection step to detect the presence of a first set of errors within the set of array bits, and toggle a selected one of the n reference bits from a first state to a second state if an error count associated with the first ECC error detection step is greater than a predetermined threshold.

9. The semiconductor memory of claim 8, wherein the self-heal module is further configured to store log values relating to the first set of errors and to reset the log values after toggling the selected one of the n reference bits from a first state to a second state.

10. The semiconductor memory of claim 8, wherein the self-heal module is configured to toggle the selected one of the n reference bits during a write operation, and to perform the first ECC error detection step during a read operation.

11. The semiconductor memory of claim 8, wherein n is equal to two, and the predetermined threshold is equal to two.

12. The semiconductor memory of claim 8, wherein m=16 to 32, n=2, and the predetermined threshold comprises a value selected from the values consisting of 2, 3, and 4.

13. An MRAM memory comprising:
   a set of magnetoresistive array bits within the MRAM memory array consisting of first data bits and second data bits;

a first magnetoresistive reference bit within the MRAM memory array and associated with one of the first data bits and one of the second data bits; and a self-heal module configured to perform a first ECC error detection step to determine if a first set of errors exists within the first data bits, perform a second ECC error detection step to determine if a second set of errors exists within the second data bits, and toggle the first magnetoresistive reference bit from a first state to a second state if errors exist on both the associated bit of the first data bits and the associated bit of the second data bits.

14. The MRAM memory of claim 13 wherein the first and second ECC error detection steps comprise using a Hamming Code.

15. The MRAM memory of claim 13 wherein the first data bits are arraigned parallel to the second data bits.

16. The MRAM memory of claim 13 wherein the first and second ECC error detections steps are accomplished simultaneously.

17. The MRAM memory of claim 13 further comprising a second magnetoresistive reference bit, wherein the first magnetoresistive reference bit is programmed to a first state and the second magnetoresistive reference bit is programmed to a second state for determining the state of one of the first and second data bits.

18. The MRAM memory of claim 13 wherein the self-heal module is further configured to correct the error in the first magnetoresistive reference bit by programming the state of the first magnetoresistive reference bit, the first magnetoresistive reference bit being associated with the identified error in the first data bits and the identified error in the second data bits.

* * * * *